(12) United States Patent
Nagashima et al.

(10) Patent No.: US 7,786,768 B2
(45) Date of Patent: Aug. 31, 2010

(54) WAVEFORM GENERATING CIRCUIT AND SPREAD SPECTRUM CLOCK GENERATOR

(75) Inventors: Tamotsu Nagashima, Tokyo (JP); Koji Tomioka, Tokyo (JP)

(73) Assignee: Asahi Kasei Microsystems Co., Ltd., Tokyo (JP)

(*) Notice: Subject to any disclaimer, the term of this patent is extended or adjusted under 35 U.S.C. 154(b) by 0 days.

(21) Appl. No.: 12/071,888

(22) Filed: Feb. 27, 2008

(65) Prior Publication Data

US 2008/0224741 A1    Sep. 18, 2008

Related U.S. Application Data

(62) Division of application No. 11/302,140, filed on Dec. 14, 2005, now Pat. No. 7,355,461.

(30) Foreign Application Priority Data

Dec. 15, 2004    (JP) .............................. 2004-363094

(51) Int. Cl.
*H03K 4/90*    (2006.01)
(52) U.S. Cl. ...................... 327/131; 327/133
(58) Field of Classification Search ......... 327/131–134, 327/170, 172, 175
See application file for complete search history.

(56) References Cited

U.S. PATENT DOCUMENTS

| | | | | |
|---|---|---|---|---|
| 5,422,557 A * | 6/1995 | Lee et al. | ................... | 318/807 |
| 5,438,291 A * | 8/1995 | Carbou et al. | ............... | 327/170 |
| 5,488,627 A | 1/1996 | Hardin et al. | | |
| 5,574,392 A * | 11/1996 | Jordan | ........................ | 327/131 |
| 5,640,131 A | 6/1997 | Kawasaki et al. | | |
| 5,804,000 A * | 9/1998 | Shirai et al. | ............. | 152/209.15 |
| 5,969,557 A | 10/1999 | Tanzawa et al. | | |
| 6,191,630 B1 | 2/2001 | Ozawa et al. | | |
| 7,183,818 B2 | 2/2007 | Tsuji | | |

FOREIGN PATENT DOCUMENTS

JP    46-016011    4/1971

(Continued)

OTHER PUBLICATIONS

Webb et al., "Spread Spectrum Clock Generation", Electromagnetic Environmental Engineering Information (Denji Kankyo Kogaku Joho) EMC, pp. 22-28; May Issue, 1997.

(Continued)

*Primary Examiner*—Dinh T. Le
(74) *Attorney, Agent, or Firm*—Finnegan, Henderson, Farabow, Garrett & Dunner, LLP (57) ABSTRACT

A spread spectrum clock generator is provided which improves the spread spectrum effect with little increasing the circuit cost by modifying the shape of a triangular wave used for frequency modulation by a simple method. The output signal of the modulation waveform generating circuit has such a modulation waveform as indicated by solid lines in FIG. 2A. The modulation waveform is input to a VCO (voltage-controlled oscillator). In response to the modulation waveform, the oscillation frequency of the VCO is modulated, and the output clock that varies its frequency as illustrated in FIG. 2B is obtained. The frequency transition of the output clock involves such temporal variations as indicated by solid lines in FIG. 2C.

7 Claims, 12 Drawing Sheets

FOREIGN PATENT DOCUMENTS

| | | |
|---|---|---|
| JP | 49-000372 | 1/1974 |
| JP | 52-022858 | 2/1977 |
| JP | 06-242851 | 9/1994 |
| JP | 10-313235 | 11/1998 |
| JP | 2002-341959 | 11/2002 |
| JP | 2004-207846 | 7/2004 |
| JP | 2004-266780 | 9/2004 |
| JP | 2005-070960 | 3/2005 |
| JP | 2005-236536 | 9/2005 |
| JP | 2006-041642 | 2/2006 |
| WO | WO 2006/016414 A1 | 2/2006 |

OTHER PUBLICATIONS

Official Letter from Japanese Patent Office, dated Jul. 24, 2009 in corresponding Japanese Patent Application No. 2005-360980. (5 pages).

Office Action dated May 18, 2010 in corresponding Japanese Patent Application No. 2005-360980. [[2]] 5 pages including 2 pages for the Office Action and 3 pages of a translation thereof.

\* cited by examiner

**FIG. 1
PRIOR ART**

MODULATION WAVEFORM
FIG. 2A

OUTPUT CLOCK
FIG. 2B

FREQUENCY TRANSITION
FIG. 2C

WAVEFORM GENERATING CIRCUIT AND SPREAD SPECTRUM CLOCK GENERATOR

This application a divisional of U.S. patent application Ser. No. 11/302,140, filed Dec. 14, 2005 now U.S. Pat. No. 7,355, 461 and claims priority from Japanese Patent Application No. 2004-363094 filed Dec. 15, 2004, which is incorporated hereinto by reference.

BACKGROUND OF THE INVENTION

1. Field of the Invention

The present invention relates to a waveform generating circuit for making certain modifications to a triangular wave signal, and to a spread spectrum clock generator using the waveform generating circuit.

The spread spectrum clock generator refers to a clock generator for reducing electromagnetic radiation by varying the clock frequency by the so-called spread spectrum clock technique.

2. Description of the Related Art

In the field of the digital circuit, it is known to vary the clock frequency slightly to reduce the electromagnetic radiation caused by the clock.

To obtain the frequency modulated clock, it is generally performed to input a triangular wave to a VCO (voltage-controlled oscillator).

Figure 1:
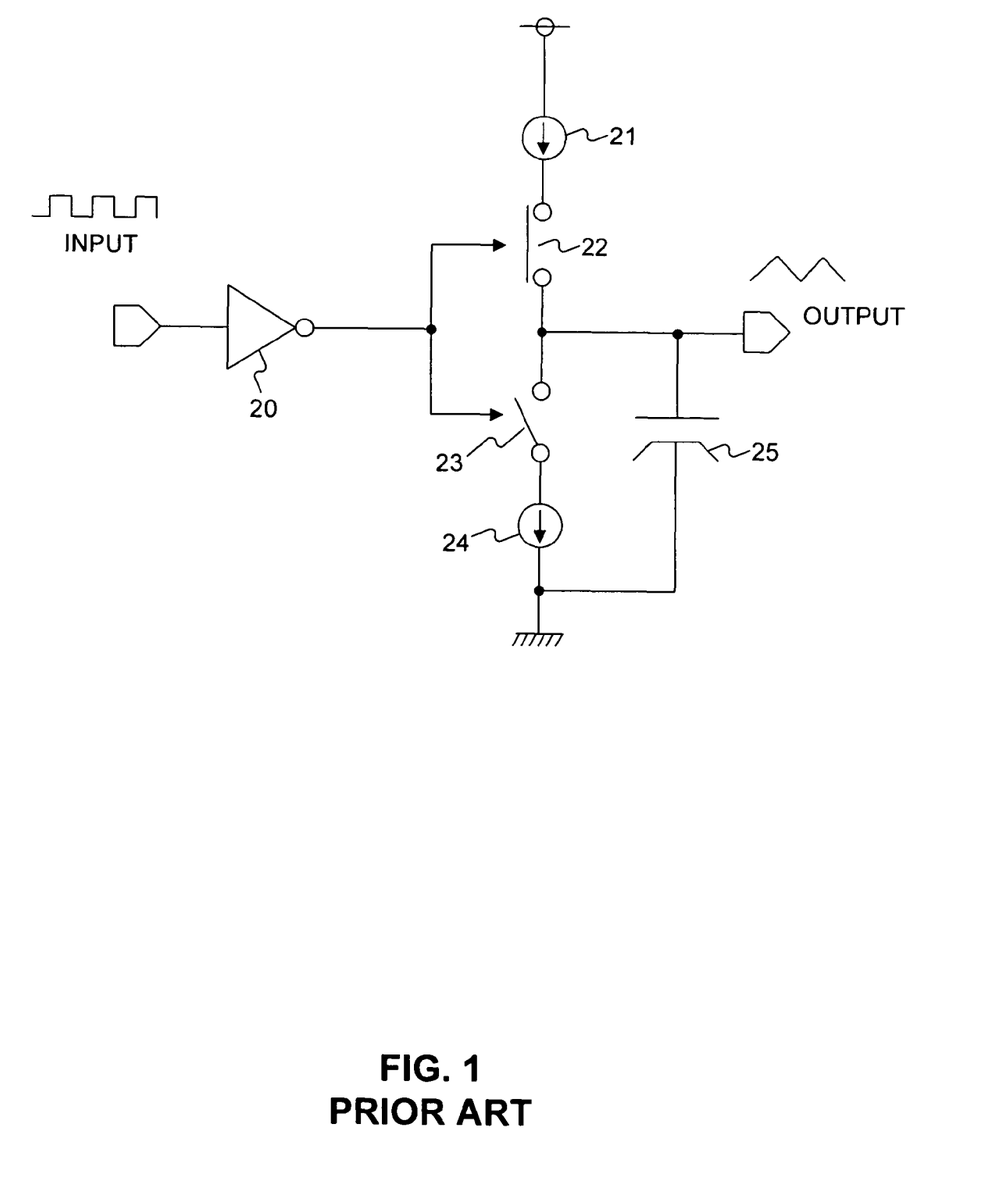
FIG. 1 is a circuit diagram showing an example of a conventional triangular wave generating circuit.

FIG. 1 shows an example of a triangular wave generating circuit conventionally known. The input signal to the circuit is a rectangular wave, and complementary switch 22 and switch 23 which are driven through an inverter 20 repeat turning on and off alternately. Thus, a capacitor (CAP) 25 is supplied with the current from a current source 21 and the current from a source 24 alternately. In this way, the CAP 25 repeats charge and discharge, thereby outputting a triangular wave.

Japanese patent application laid-open No. 06-242851 discloses the following object and configuration (in abstract and FIG. 1). Its object is "to make the interference visually inconspicuous on a screen caused by spurious radiation being fed to a TV tuner, which is generated by digital circuits such as a microcomputer and the like". Its configuration is "a circuit for generating a clock pulse of a microcomputer, which includes pulse generating means for generating a pulse signal with a fixed frequency; and random modulation means for modulating the pulse signal at random the pulse generating means generates, wherein the random modulation means includes a triangular wave generator; a frequency modulator for carrying out frequency modulation of the triangular wave produced by the triangular wave generator; and a frequency converter for carrying out frequency conversion based on the output of the frequency modulator and a signal obtained from the pulse generator, and wherein the output of the frequency converting means is used as the clock pulse".

However, when the frequency characteristic applied for the input to the modulation circuit or the oscillator is insufficient for achieving the frequency modulation by the triangular wave as described above, there arises a problem in that the vertices of the triangular wave round, and ideal spread spectrum is not achieved.

When the spread spectrum is brought about by the triangular wave with such a shape, a spectrum is observed which has higher level portions at both ends of the spread spectrum than in other regions, which presents a problem in that the effect of the spread spectrum is impaired.

On the other hand, even if the frequency modulation is carried out using a triangular wave with an ideal shape, since the EMI (electromagnetic interference) measurement is made based on the finite frequency resolution and measurement integral time, the frequency transition stays at frequencies near the vertices of the triangular wave longer than in other frequency ranges to be measured. As a result, a problem arises in that the spectrum is observed which has the higher level portions than in the other regions (see FIG. 7A).

To circumvent such a problem, a technique is conceived which carries out modulation after changing the waveform for the frequency modulation to a particular shape. The technique, however, must pay extra cost in both a circuit area and cost (see Electromagnetic Compatibility EMC, May, pp. 22-28).

In view of the foregoing problems, a first object of the present invention is to provide a waveform generating circuit for generating a modified triangular wave signal suitable for being input to a frequency modulation circuit such as a VCO (voltage-controlled oscillator).

A second object of the present invention is to provide a spread spectrum clock generator capable of improving the spread spectrum effect with little increase in the circuit cost by modifying the shape of the triangular wave used for the frequency modulation with a simple method.

SUMMARY OF THE INVENTION

To accomplish the object, according to one aspect of the present invention, there is provided a waveform generating circuit comprising: triangular wave generating means for generating a triangular wave signal having first slope sections and second slope sections; offset generating means for generating first offset component signals corresponding to the first slope sections, and for generating second offset component signals corresponding to the second slope sections, the second offset component signals differing from the first offset component signals; combining means for adding the triangular wave signal generated by the triangular wave generating means and the offset component signals generated by the offset generating means; and output means for delivering an output signal resulting from the addition by the combining means.

The triangular wave generating means can include: a fixed capacitor; and charge and discharge means for causing the fixed capacitor to be charged and discharged via a pair of switches turning on and off complementarily in response to an input clock signal, wherein a voltage corresponding to the first slope sections and the second slope sections is obtained across the fixed capacitor.

The offset generating means can be a fixed resistor for generating as its terminal voltage the first offset component signals and the second offset component signals by causing a charging current and a discharging current of the fixed capacitor to flow through the fixed resistor; the combining means can be a wire connection that connects the fixed capacitor and the fixed resistor in series; and the output means can be a terminal to which the fixed resistor is not connected among the two terminals of the fixed capacitor.

According to another aspect of the present invention, the offset generating means can be an auxiliary capacitor; the combining means can be a wire connection that connects the auxiliary capacitor across the input terminal of the input clock signal and a terminal of the fixed capacitor; and the output means can be a common connection point of the auxiliary capacitor and the fixed capacitor.

According to still another aspect of the present invention, the first offset component signals and the second offset component signals can have opposite polarities to each other.

The waveform generating circuit can generate an asymmetric wave having an operation level that varies at a predetermined period, and that is asymmetric before and after a maximum point and a minimum point of the waveform.

The asymmetric wave can have a first slope section that makes a transition from a first low level to a first high level in a predetermined time period; a first level transition that makes an instant transition from the first high level to a second high level; a second slope section that makes a transition from the second high level to a second low level in a predetermined time period; and a second level transition that makes an instant transition from the second low level to the first low level.

The first slope section, the first level transition, the second slope section, and the second level transition are generated repeatedly in this order at a predetermined period.

According to another aspect of the present invention, there is provided a waveform generating circuit including: means for outputting data on a waveform of an asymmetric wave having an operation level that varies at a predetermined period, and that is asymmetric before and after a maximum point and a minimum point of the waveform; and a DAC for converting the data on the waveform to an analog signal, and for delivering an output signal.

The means for outputting can be one of a microprocessor, DSP, ROM and a programmable memory.

According to another aspect of the present invention, there is provided a spread spectrum clock generator including: the waveform generating circuit; and a variable frequency clock generating circuit that receives the output signal delivered by the waveform generating circuit, and generates a clock signal with a frequency corresponding to the output signal.

The means for outputting can be one of a microprocessor, DSP, ROM and a programmable memory.

The present invention can implement a waveform generating circuit for generating a modified triangular wave signal suitable for inputting to a frequency modulation circuit such as a VCO. In addition, according to the present invention, the shape of the triangular wave used for the frequency modulation can be modified by a simple method, which makes it possible to implement the spread spectrum clock generator capable of improving the spread spectrum effect without increasing the circuit cost so much.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 2A:
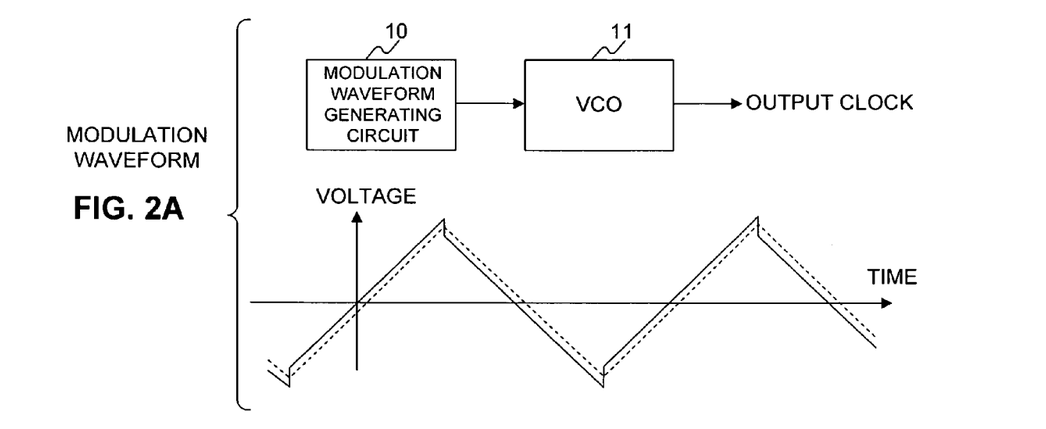
FIGS. 2A-2C are diagrams showing a spread spectrum clock generator in accordance with the present invention, and signal waveforms of various portions.
Figure 2B:
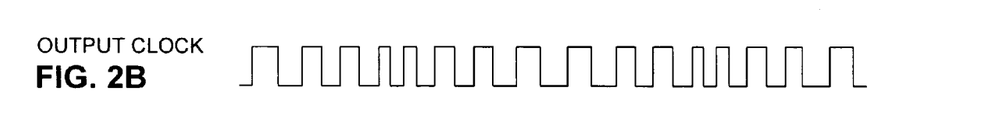
Figure 2C:
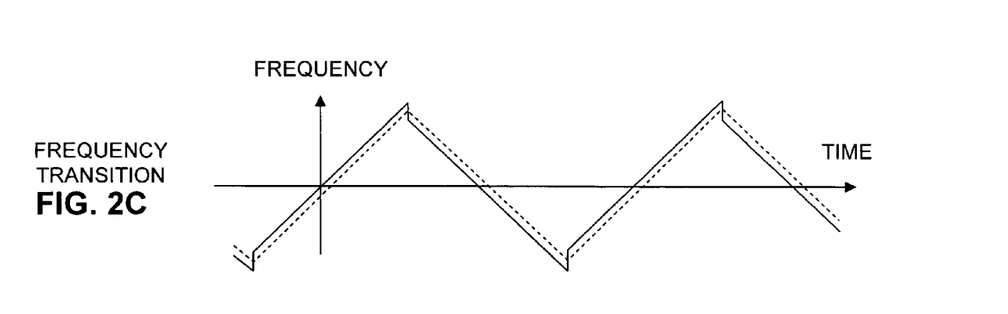

FIGS. 2A-2C show a spread spectrum clock generator of an embodiment in accordance with the present invention, and signal waveforms of various portions. In these figures, the reference numeral 10 designates a modulation waveform generating circuit whose output signal has a modulation waveform as illustrated by solid lines in FIG. 2A. The modulation waveform is input to a VCO (voltage-controlled oscillator) 11. Thus, the oscillation frequency of the VCO 11 is modulated in response to the modulation waveform, providing the output clock with frequency variations as illustrated in FIG. 2B. The frequency transition of the output clock has temporal variations as indicated by solid lines of FIG. 2C.

Figure 3:
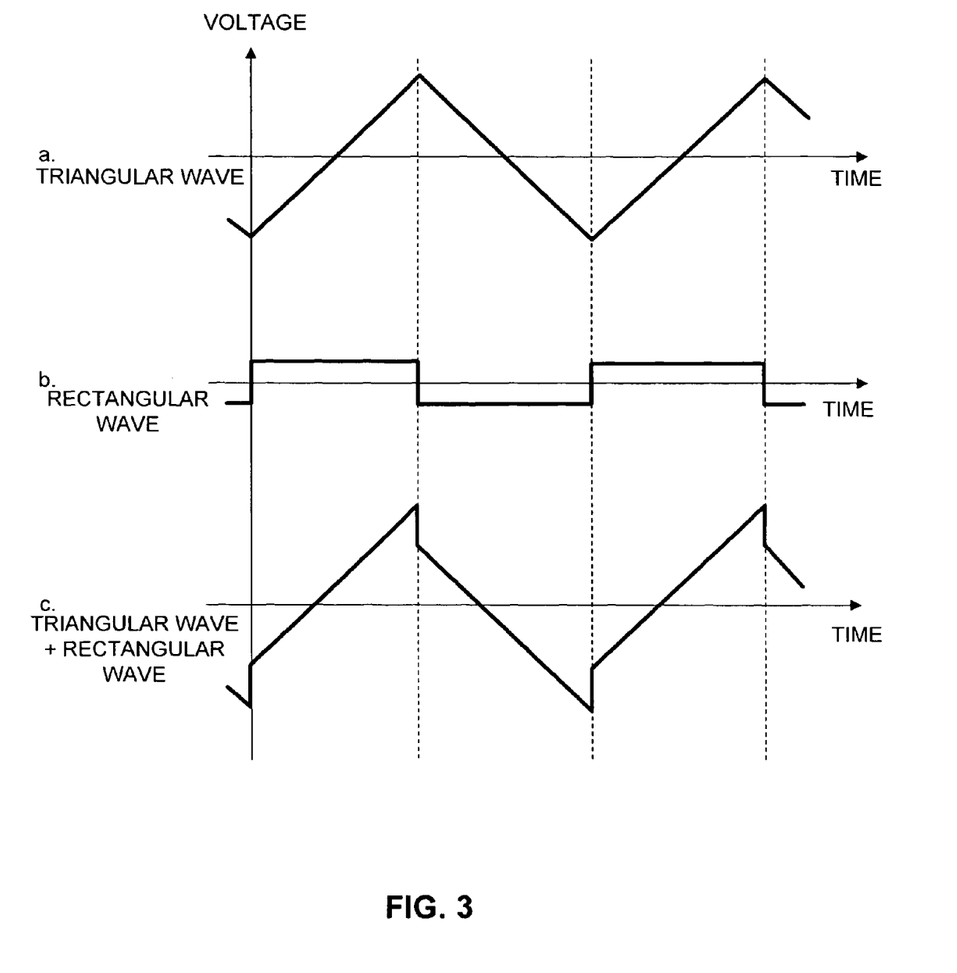
FIG. 3 is a diagram showing a method of generating a modulation waveform represented by solid lines in FIG. 2A.

FIG. 3 shows an example of a method of generating the modulation waveform represented by solid lines in FIG. 2A. FIG. 3(a) shows a pure triangular wave, and FIG. 3(b) shows a rectangular wave for an offset, which has transition points at the same timing as the vertices of the triangular wave. Adding the triangular wave of FIG. 3(a) and the rectangular wave of FIG. 3(b) results in the waveform as illustrated in FIG. 3(c), which shifts sides from vertices to the next vertices of the triangular wave upward or downward.

Figure 11:
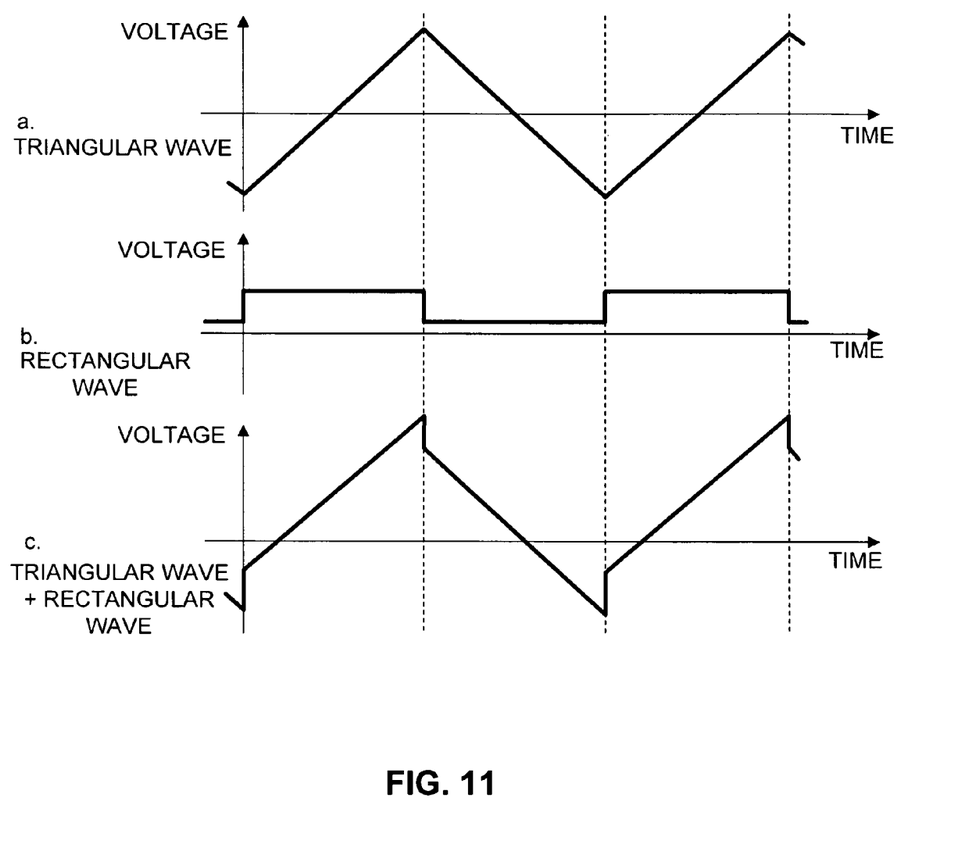
FIG. 11 is a diagram illustrating a method of generating the modulation waveform represented by solid lines in FIG. 2A.

FIG. 11 illustrates another method of generating the modulation waveform indicated by the solid lines in FIG. 2A. FIG. 11(a) shows a pure triangular wave as shown in FIG. 3(a). FIG. 11(b) shows a rectangular wave for an offset, which has transition points at the same timing as the vertices of the triangular wave. Although the rectangular wave of FIG. 3(b) has a fixed signal level with its polarization reversed at the transition points, the rectangular wave of FIG. 11(b) has its signal level changed at the transition points without the polarization reversal. Accordingly, adding the triangular wave of FIG. 11(a) and the rectangular wave of FIG. 11(b) results in the waveform as illustrated in FIG. 11(c), which shifts sides from vertices to the next vertices of the triangular wave upward or downward in accordance with the signal levels.

Figure 12:
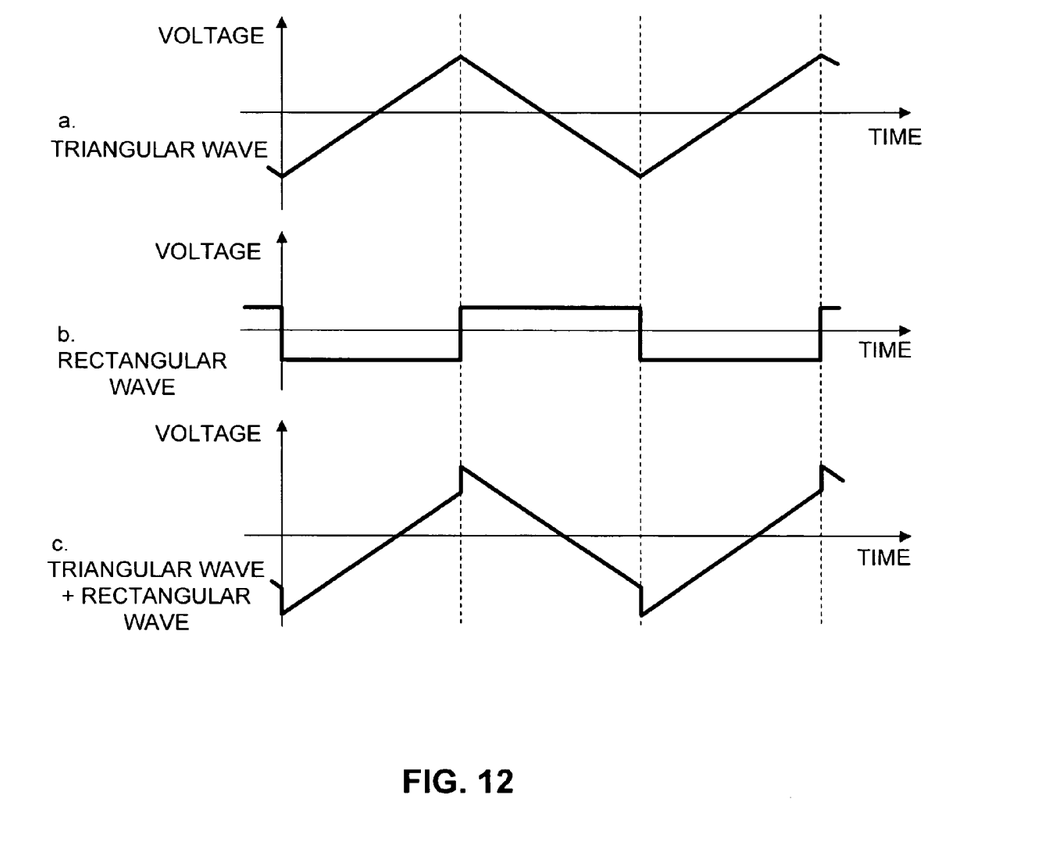
FIG. 12 is a diagram illustrating another method of generating the modulation waveform represented by solid lines in FIG. 2A.

FIG. 12 illustrates still another method of generating the modulation waveform indicated by the solid lines in FIG. 2A. FIG. 12(a) shows a pure triangular wave as FIG. 3(a). FIG. 11(b) shows a rectangular wave for an offset, which has the transition points at the same timing as the vertices of the triangular wave, but has the opposite polarity to that of FIG. 3(b). Specifically, the rectangular wave in FIG. 12(b) has the negative polarity in regions in which the rectangular wave in FIG. 3(b) has the positive polarity, and has the positive polarity in regions in which the rectangular wave in FIG. 3(b) has the negative polarity. Thus, adding the triangular wave of FIG. 12(a) and the rectangular wave of FIG. 12(b) results in the waveform which slopes up toward the right, has a step at the top, slopes down toward the right and has a step at the bottom.

Figure 4:
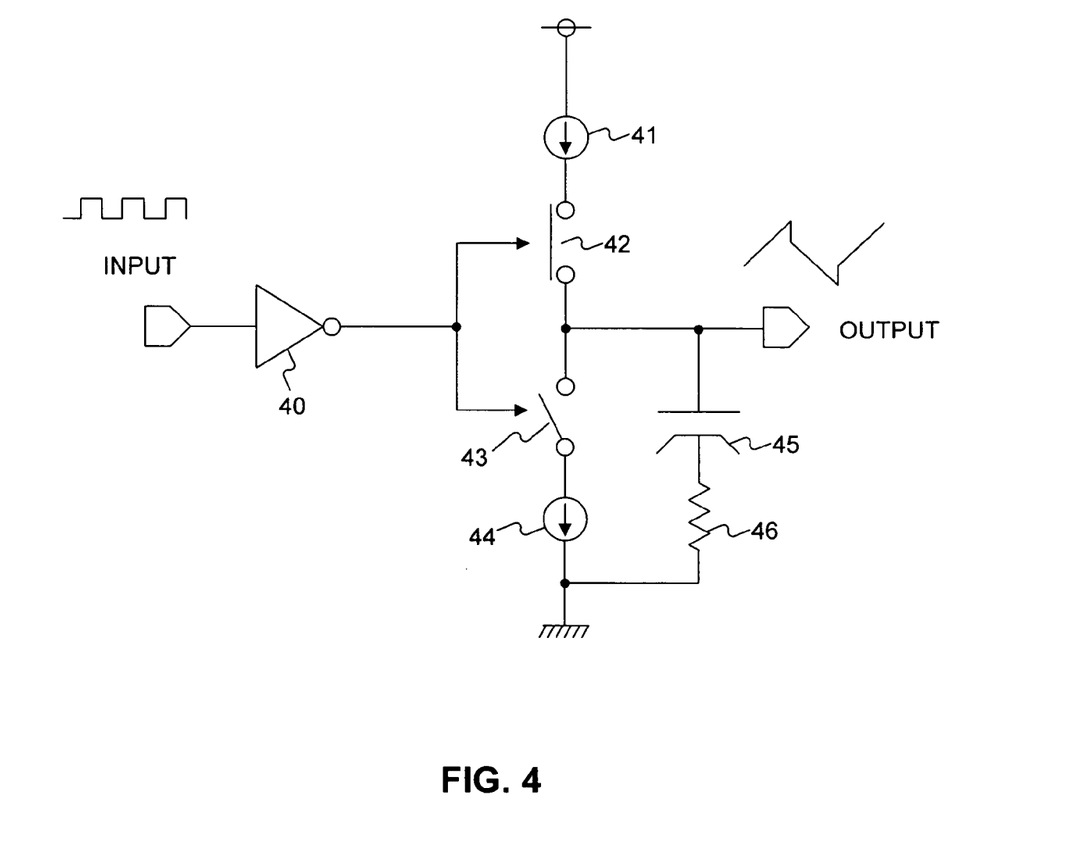
FIG. 4 is a circuit diagram showing a concrete configuration of the modulation waveform generating circuit 10 as shown in FIG. 2A.

FIG. 4 shows a concrete circuit configuration of the modulation waveform generating circuit 10 as shown in FIG. 2A. The input to the circuit is a rectangular wave as in the conventional example of FIG. 1, and complementary switch 42 and switch 43 which are driven through an inverter 40 repeat turning on and off alternately. Thus, a capacitor (CAP) 45 is supplied with the current from a current source 41 and the current from a current source 44 alternately. As a result, the CAP 45 repeats charge and discharge. When the charge and discharge are repeated, an offset voltage is generated across a resistor 46 connected between the CAP 45 and a ground. Thus, while the switch 42 is in the ON state and the switch 43 is in the OFF state, the offset voltage, which is generated with an amount of (resistance of the resistor 46)×(supply current of the current source 41), is added to the output. On the other hand, while the switch 42 is in the OFF state and the switch 43 is in the ON state, the offset voltage, which is generated with an amount of (resistance of the resistor 46)×(supply current of the current source 44), is subtracted from the output. The addition and subtraction can provide as the output waveform the waveform that shifts the sides from vertices to the next vertices of the triangular wave upward or downward.

Figure 5:
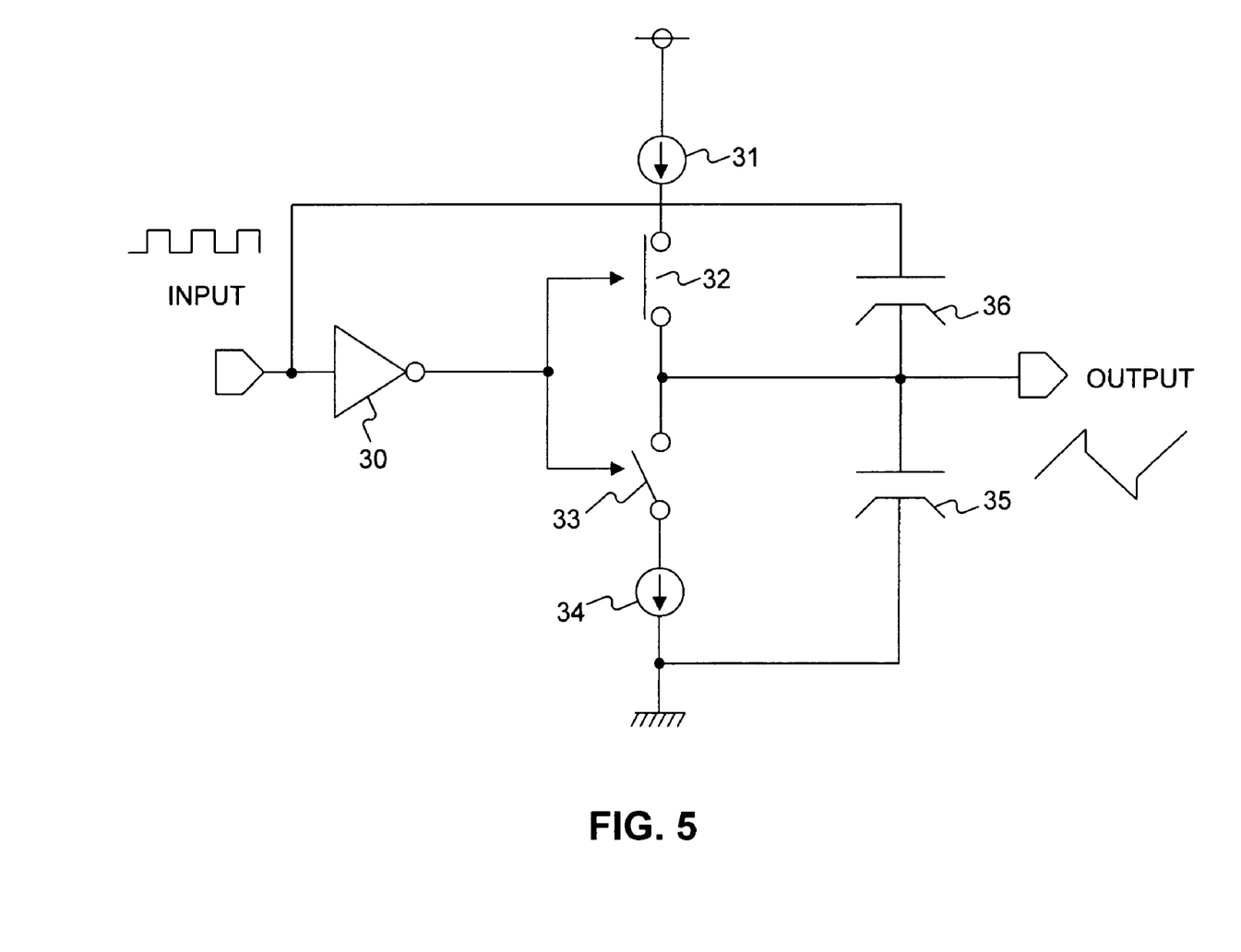
FIG. 5 is a circuit diagram showing another concrete configuration of the modulation waveform generating circuit 10 as shown in FIG. 2A.

FIG. 5 shows another concrete circuit configuration of the modulation waveform generating circuit 10. The input to the circuit is also a rectangular wave, and repeating alternate turning on and off of the complementary switches 32 and 33 driven by the inverter 30 causes the currents from the current source 31 and current source 34 to flow into a capacitor (CAP) 35. As a result, the charge and discharge of the CAP 35 are repeated. In addition, a capacitor (CAP) 36 is connected across an input terminal and an output terminal in the present circuit. Accordingly, as long as the input rectangular wave is at a high level, the extra charges determined by the capacitance of the CAP 36 and by the capacitance of the CAP 35 are stored in the CAP 35. As a result, as long as the input rectangular wave is at the high level, the upward slope voltage across the CAP 35 is shifted upward. On the other hand, as long as the input rectangular waveform is at a low level (zero volt), the charge of the CAP 35 flows into the CAP 36. Thus, the downward slope voltage across the CAP 35 is shifted downward.

Figure 8:
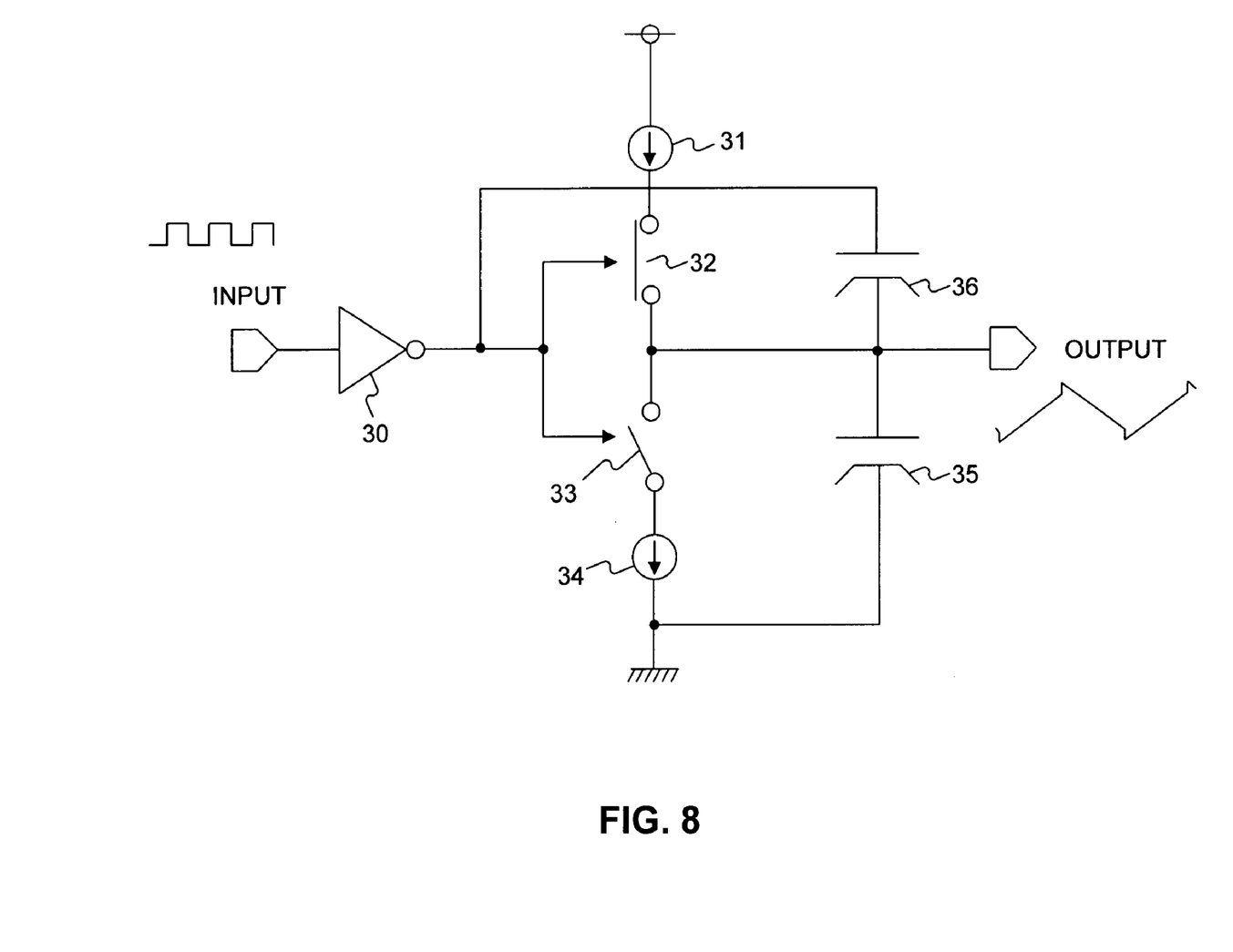
FIG. 8 is a circuit diagram showing another concrete configuration of the modulation waveform generating circuit 10 as shown in FIG. 2A.

FIG. 8 shows another concrete circuit configuration of the modulation waveform generating circuit 10. The input terminal is connected to the inverter 30, and the output terminal of the inverter 30 is divided into three branches. Two of the three branches are connected to the switches 32 and 33 to turn on and off the switches in response to the high and low of the signal output from the inverter 30. The current sources 31 and 34 and the switches 32 and 33 are connected in series in the order of the current source 31, switch 32, switch 33 and current source 34. The current source 34 has its end, which is not connected to the switch 33, connected to the ground. The output terminal is connected to the connecting point of the switch 32 and switch 33. The CAP 35 is connected across the output terminal and the ground. The CAP 36 is connected across the output terminal and the output of the inverter 30.

Although the CAP 36 of the modulation waveform generating circuit shown in FIG. 5 is connected across the input terminal and the output terminal, the CAP 36 of the modulation waveform generating circuit of FIG. 8 is connected across the output of the inverter 30 and the output terminal. Changing the connecting position of the CAP 36 can reverse the directions of the steps of the output waveform because the CAP 36 is supplied with the voltage opposite in polarity to the voltage supplied to the CAP 36 shown in FIG. 5.

The directions of the steps of the output waveform can also be changed by reversing the polarity of the switches 32 and 33. Specifically, the directions of the steps of the output waveform can be altered by changing whether the switches are closed when the output of the inverter 30 is high or low.

Figure 9:
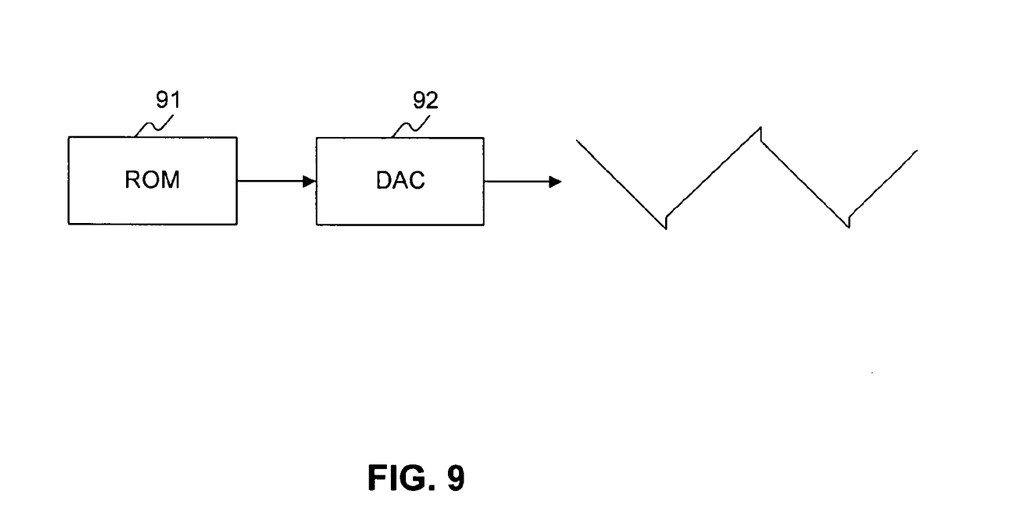
FIG. 9 is a circuit diagram showing still another concrete configuration of the modulation waveform generating circuit 10 as shown in FIG. 2A.

FIG. 9 shows another concrete circuit configuration of the modulation waveform generating circuit 10. The modulation waveform generating circuit 10 has a ROM 91 and a digital-to-analog converter (DAC) 92. The ROM 91 stores data on the waveform in advance which has offsets in the slopes. The ROM 91 supplies its output data string to the DAC 92, and the DAC 92 converts the data to an analog signal and outputs it as the output signal. Thus, the waveform having the offsets in the slopes can be produced as in the foregoing embodiment. Instead of the ROM 91, it is also possible for the present embodiment to use a processing unit such as a programmable memory, microprocessor or DSP (digital signal processor) (not shown) to generate a prescribed data string, thereby being able to produce the waveform having the offsets in the slopes just as in the case of using the ROM 91.

Figure 10A:
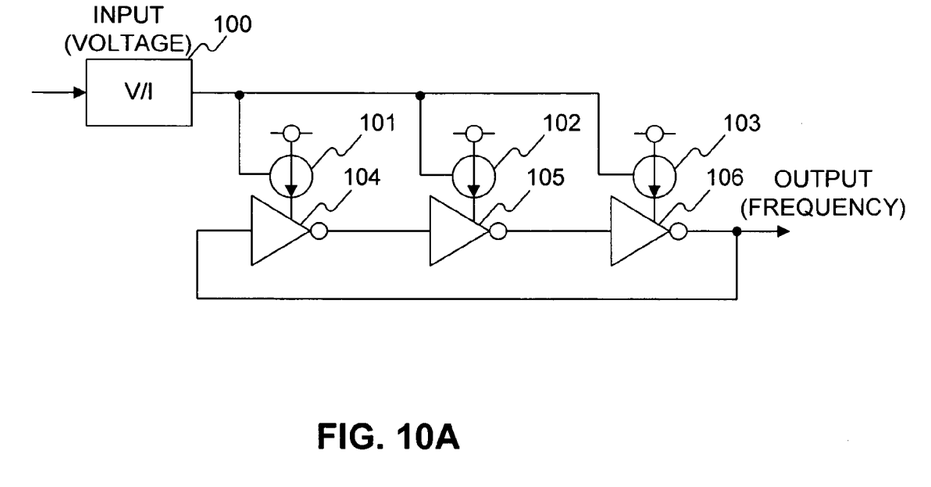
FIG. 10A is a circuit diagram showing a concrete configuration of the VCO 11.
Figure 10B:
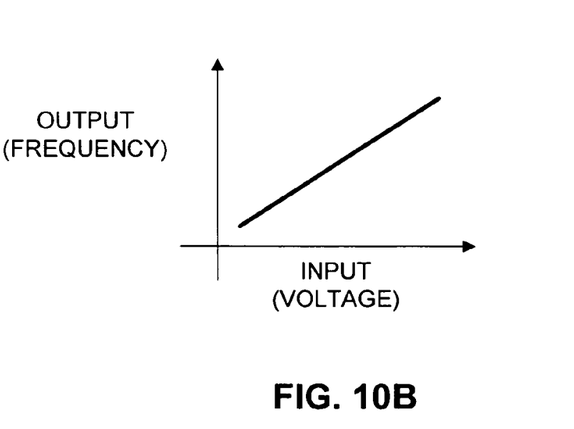
FIG. 10B is a diagram illustrating relationships between an ordinary input voltage and an output frequency of the VCO 11.

FIG. 10A shows a concrete circuit configuration of the VCO 11. The VOC 11 includes inverters 104-106 whose speed can be varied by a current, current sources 101-103 for supplying currents to the inverters 104-106, and a V/I (voltage/current) converter 100 for determining the currents to be supplied to the inverters 104-106 by controlling the current sources 101-103 in response to the voltage. The voltage supplied via the input terminal is converted to the current corresponding to the voltage by the V/I converter 100, and the current is supplied to the inverters 104-106. FIG. 10B illustrates relationships between the ordinary input voltage to the VCO 11 and the output frequency. Generally, the frequency of the output signal increases with the current supplied to the inverters 104-106. Thus, the output frequency increases with the input voltage. However, it is also possible to decrease the output frequency with the input voltage by changing the polarity of the V/I converter 100.

Figure 6A:
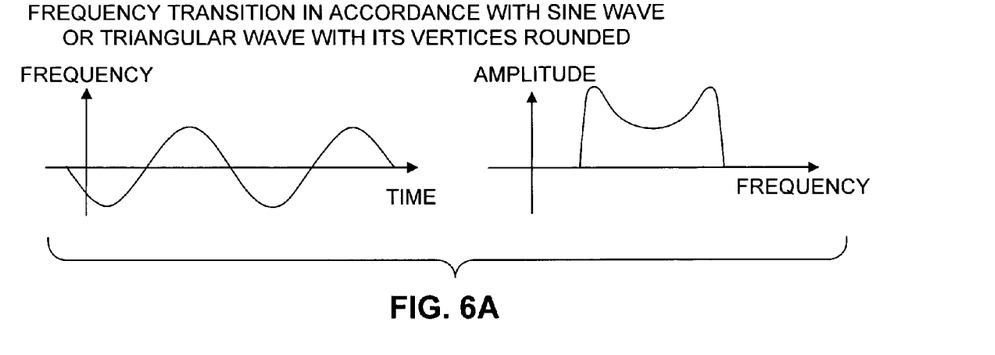
FIGS. 6A-6C are diagrams illustrating comparison between the effect of the spread spectrum by the conventional modulation wave generating circuit (FIG. 1) and the effect of the spread spectrum by embodiments (FIGS. 2A-5) in accordance with the present invention.
Figure 6B:
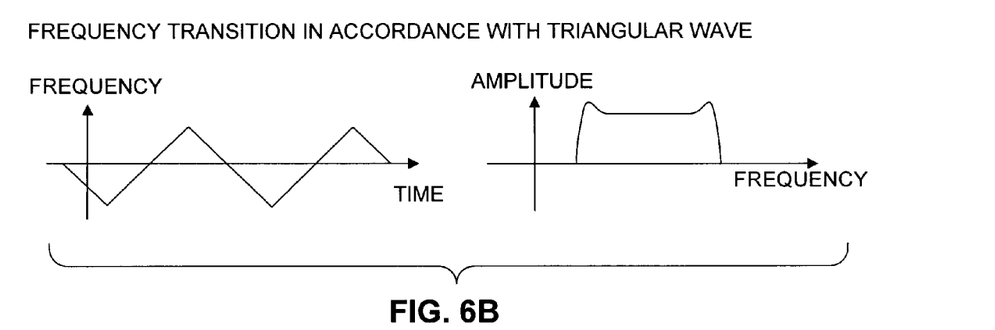
Figure 6C:
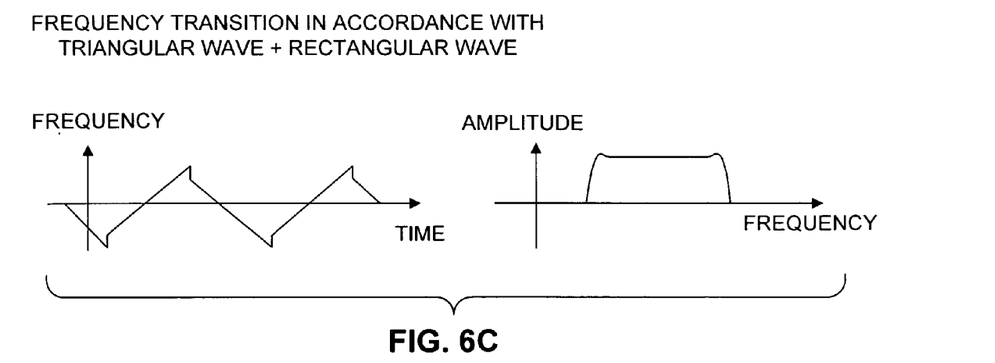

FIGS. 6A and 6B are graphs illustrating for comparison the effects of the spread spectrum by the conventional modulation wave generating circuit (see FIG. 1) and the spread spectrum by the embodiments in accordance with the present invention (see FIG. 2A to FIG. 5). FIG. 6A shows a spectrum when a sine wave or rounded triangular wave is used as the frequency modulation waveform. Since the frequency modulation becomes mild near the top and bottom vertices of the sine wave, the spread spectrum has a shape with peaks at both ends FIG. 6B shows a spectrum when a triangular wave is used as the frequency modulation waveform. When the triangular wave is used as the frequency modulation waveform, although the temporal change of the frequency modulation is constant, the EMI measurement is made at a finite frequency resolution. Accordingly, the frequency transition stays in the frequency resolution at the vertices of the triangular wave for a time longer than other times, resulting in the spread spectrum having peaks at both ends as well. In contrast with the two examples, the embodiments in accordance with the present invention employ the waveform as shown in FIG. 6C, which shifts the sides from the vertices to the next vertices of the triangular wave upward or downward. Thus, considering the vertices of the waveform, the stay duration at a fixed frequency band becomes constant. As a result, the peaks at both ends of the spectrum can be reduced or flattened.

Figure 7A:
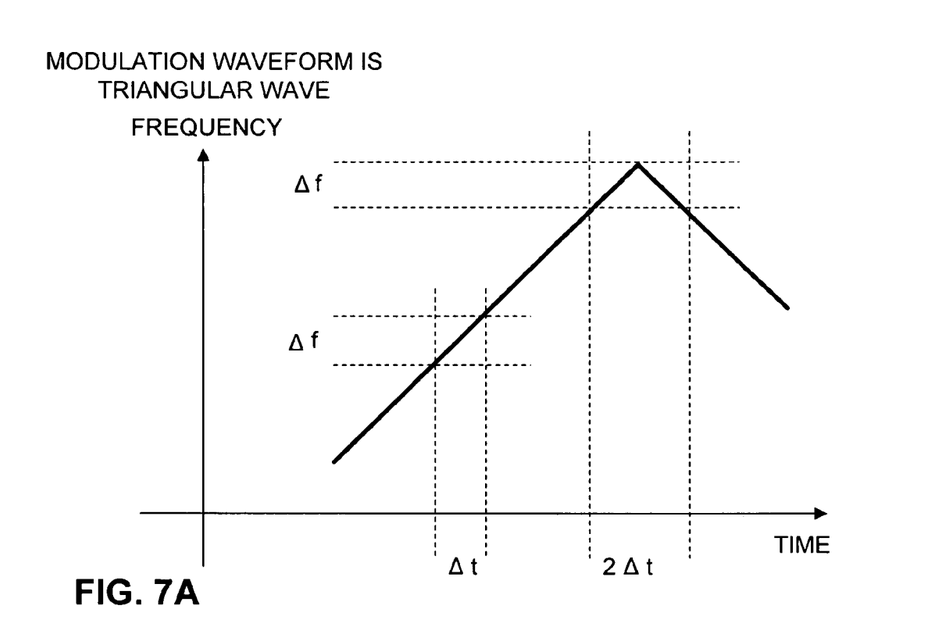
FIGS. 7A and 7B are diagrams illustrating in more detail a reduction effect or flattening of the spectrum as shown in FIG. 6C.
Figure 7B:
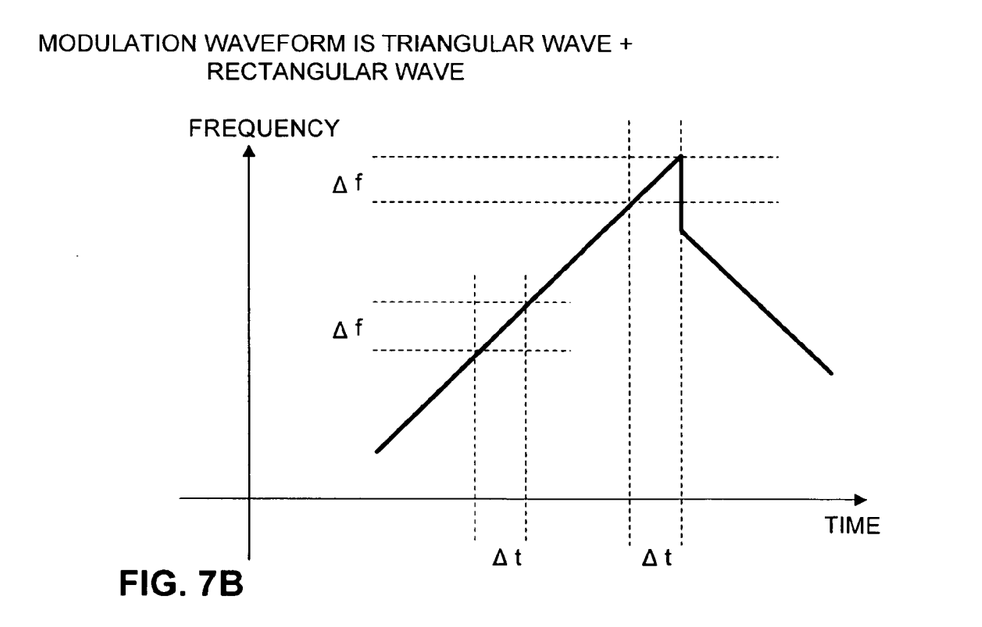

FIGS. 7A and 7B are diagrams illustrating the reduction effect or flattening of the spectrum shown in FIG. 6C in more detail. FIG. 7A is a diagram illustrating the case where the modulation waveform is a triangular wave as in the conventional example, and the frequency resolution of the EMI measurement is $\Delta f$. As is clear from FIG. 7A, assuming that the time passing through the frequency region $\Delta f$ is $\Delta t$ in portions other than the vertices of the triangular wave, then the time passing through the frequency region $\Delta f$ at the vertices is $2\Delta t$ including the time of a turn. Thus, in this frequency region, the spectrum is observed which is higher than in the other portions. On the other hand, FIG. 7B is a diagram illustrating the embodiments in accordance with the present invention, which employs the waveform that shifts the sides from the vertices to the next vertices of the triangular wave upward or downward as the modulation waveform. As is clear from FIG. 7B, as for the waveform of the present embodiment, the time for passing through the frequency region with the frequency resolution $\Delta f$ is identical for the portions at the vertices and for the other portions, the two ends of the spread spectrum can be flattened.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes and modifications as fall within the true spirit of the invention.

What is claimed is:

1. A waveform generating circuit comprising:
    a source of digital data that represents an asymmetric triangular waveform having an amplitude that varies cyclically and that is asymmetric before and after a maximum amplitude at a maximum point and minimum amplitude at a minimum point of each cycle of the triangular waveform; and
    a DAC for converting said data to an analog asymmetric triangular waveform; and wherein a first level transition at the maximum point that makes an instant transition from a first high level to a second high level and a second level transition at the minimum point that makes an instant transition from a first low level to a second low level.

2. A waveform generating circuit comprising:
    a source of digital data that represents an asymmetric triangular waveform having an amplitude that varies cyclically and that is asymmetric before and after a maximum amplitude and minimum amplitude of each cycle of the waveform; and
    a DAC for converting said data to an analog with asymmetric triangular waveform, wherein the analog asymmetric triangular waveform includes:
        a first slope section that makes a transition from a first low level to a first high level over a first time duration within each cycle of said asymmetric waveform;
        a first level transition that makes an instant transition from the first high level to a second high level;
        a second slope section that makes a transition from the second high level to a second low level over a second time duration within each cycle of said asymmetric waveform; and
        a second level transition that makes an instant transition from the second low level to the first low level.

3. The waveform generating circuit as claimed in claim 2, wherein the first slope section, the first level transition, the second slope section, and the second level transition are generated repeatedly in this order during each cycle of said analog asymmetric triangular waveform.

4. The waveform generating circuit as claimed in claim 2, wherein said source of digital data comprises one of a microprocessor, DSP, ROM and a programmable memory.

5. A spread spectrum clock generator comprising:
    the waveform generating circuit as claimed in one of claims 2, 3, and 4; and
    a variable frequency clock generating circuit that receives the analog signal by said waveform generating circuit, and generates a clock signal with a frequency corresponding to the analog asymmetric triangular waveform.

6. A waveform generating circuit comprising:
    a source of digital data that represents an asymmetric triangular waveform having an amplitude that varies cyclically and that has an offset including an abrupt discontinuity in a pattern of digital data before and after a maximum amplitude at a maximum point and minimum amplitude at a minimum point of each cycle of the waveform;
    a DAC for converting said data to an analog asymmetric triangular waveform; and wherein a first level transition at the maximum point that makes an instant transition from a first high level to a second high level and a second level transition at the minimum point that makes an instant transition from a first low level to a second low level.

7. A waveform generating circuit comprising:
    a source of digital data that represents an asymmetric triangular waveform having an amplitude that varies cyclically and that has an offset including a straight line at, and is asymmetric before and after, a maximum amplitude at a maximum point and minimum amplitude at a minimum point of each cycle of the waveform;
    a DAC for converting said data to an analog asymmetric triangular waveform; and wherein a first level transition at the maximum point that makes an instant transition from a first high level to a second high level and a second level transition at the minimum point that makes an instant transition from a first low level to a second low level.

* * * * *

UNITED STATES PATENT AND TRADEMARK OFFICE
CERTIFICATE OF CORRECTION

PATENT NO. : 7,786,768 B2
APPLICATION NO. : 12/071888
DATED : August 31, 2010
INVENTOR(S) : Tamotsu Nagashima et al.

It is certified that error appears in the above-identified patent and that said Letters Patent is hereby corrected as shown below:

Claim 1, column 7, line 38, after "form", delete "and".

Claim 2, column 7, line 52, after "analog", delete "with".

Signed and Sealed this
Eighth Day of March, 2011

David J. Kappos
*Director of the United States Patent and Trademark Office*